United States Patent [19]
Sato

[11] Patent Number: 5,831,337
[45] Date of Patent: Nov. 3, 1998

[54] VERTICAL-TYPE TRANSISTOR DEVICE, HAVING A BUMP ELECTRODE THAT HAS A SHAPE WITH NO INTERIOR ANGLE EXCEEDING 270°

[75] Inventor: Hiroya Sato, Nara, Japan

[73] Assignee: Sharp Kabushiki Kaisha

[21] Appl. No.: 685,671

[22] Filed: Jul. 26, 1996

[30] Foreign Application Priority Data

Jul. 27, 1995 [JP] Japan ................................ 7-192261

[51] Int. Cl.⁶ .......................... H01L 23/48; H01L 23/52; H01L 29/40; H01L 27/082
[52] U.S. Cl. ......................... 257/780; 257/737; 257/738; 257/584; 257/587; 257/578
[58] Field of Search .................... 257/584, 587, 257/578, 780, 737, 738

[56] References Cited

U.S. PATENT DOCUMENTS 5,084,750  1/1992  Adlerstein ............................. 257/584
5,349,239  9/1994  Sato ...................................... 257/579
5,373,185  12/1994  Sato ...................................... 257/584

OTHER PUBLICATIONS

Sato et al., "Bump Heat Sink Technology—A Novel Assembly Technology Suitble for Power HBTs–", 15th Annual GaAs IC Symposium Technical Digest, 1993, pp. 337–340.

Hasegawa et al, "Bump Heat Sink Technology—A Novel Assembly Technology Suitable for Power HBTs", Technical Report of IEICE, 1994, pp. 1–6.

Sato et al, "Carbon–Doped Al GaAs/GaAs HBTS with $f_{MAX}$ =117GHz Grown by MOCVD", technical report of the institute of electronics, information and communication engineers, ed90–135, pp. 19–24, 1991.

Bayraktaroglu et al., "Very High–Power–Density CW Operation of GaAs/AlGaAs Microwave Heterojunction Bipolar Transistors", IEEE Electron Device Letters, vol. 14, No. 10, Oct. 1993, pp. 493–495.

Primary Examiner—Mahshid D. Saadat
Assistant Examiner—T. M. Arroyo
Attorney, Agent, or Firm—Nixon & Vanderhye P.C.

[57] ABSTRACT

A vertical transistor is provided on and extends in a first direction along a surface of a substrate. A bump electrode is formed over the transistor and crosses the transistor in a second direction perpendicular to the first direction. The bump electrode is butterfly-shaped and has a first area overlapping the transistor and a second area that does not overlap with the transistor. The size of the second area in the first direction is greater than the size of the first area in the first direction. The bump electrode shape has no interior angle exceeding 270°.

15 Claims, 8 Drawing Sheets

VERTICAL-TYPE TRANSISTOR DEVICE, HAVING A BUMP ELECTRODE THAT HAS A SHAPE WITH NO INTERIOR ANGLE EXCEEDING 270°

BACKGROUND OF THE INVENTION

1. Field of the Invention:

The present invention relates to a vertical-type transistor and a method for producing the same; and in particular, to a bump electrode of a vertical-type transistor used for power amplification and a method for producing the same. The present invention further relates to a semiconductor device including the vertical-type transistor, such as a microwave monolithic IC (hereinafter, referred to as an "MMIC").

2. Description of the Related Art:

Recently, vertical-type transistors for power amplification in a microwave range have been strongly demanded. Heterojunction bipolar transistors (hereinafter, referred to as "HBTs") are a target of attention as devices for realizing high-efficiency amplification in a microwave range for their higher gain and lower output conductance than those of GaAs FETs which are in practical use today.

As is generally known, an HBT operates at a relatively high current density and thus inevitably generates heat at a relatively high rate with respect to its unit area. In order to properly operate such an HBT, heat generated at a PN junction formed on a surface of a substrate thereof needs to be released outside the substrate.

Researchers including the inventor of the present invention have developed various vertical-type transistors and semiconductor devices, including a vertical-type transistor, such as MMICs in an attempt to realize a device which releases the heat generated at a PN junction on a surface of a substrate at a sufficiently high efficiency and also reduces the inductance, the parasitic capacitance and the like caused by the take-out leads and thus is usable in practice for power amplification in a microwave range.

Figure 4A:
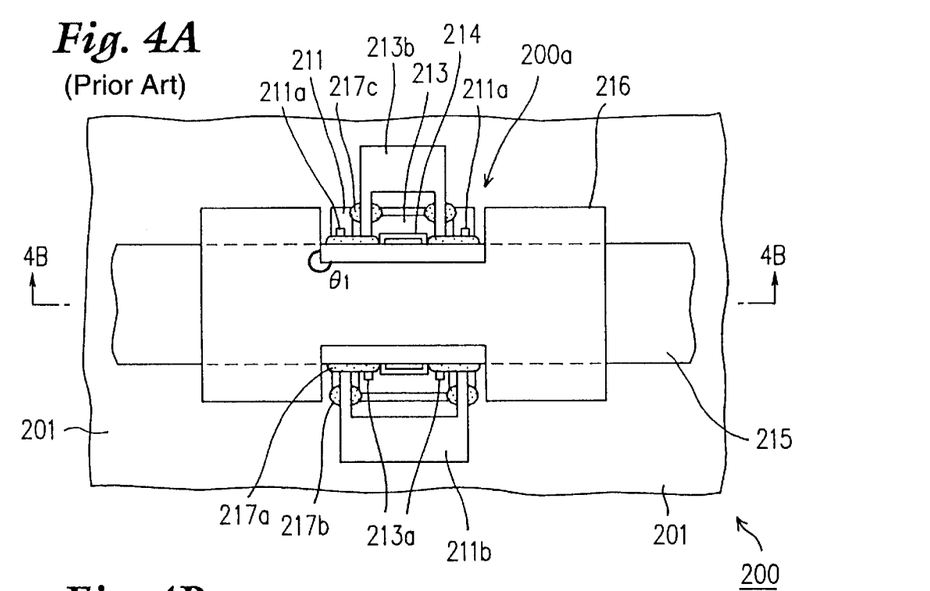
FIG. 4A is a plan view of a conventional transistor device.
Figure 4B:
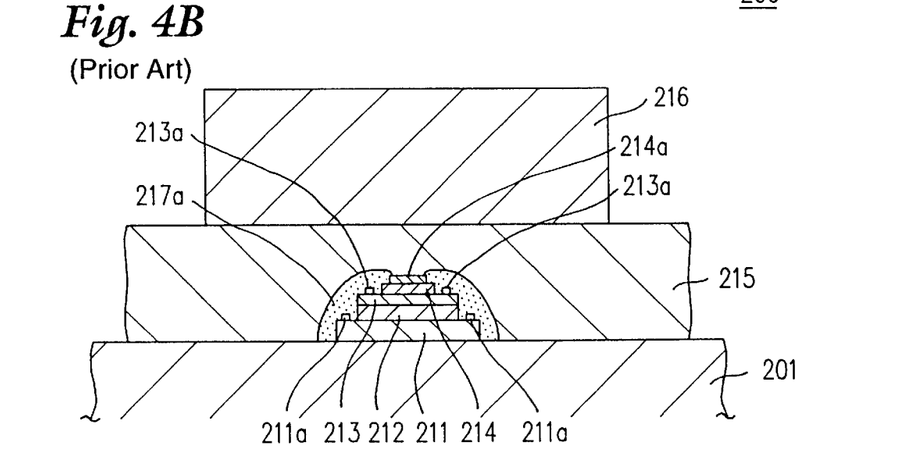
FIG. 4B is a cross sectional view of the conventional transistor device shown in FIG. 4A taken along lines 4B—4B in FIG. 4A.
Figure 4C:
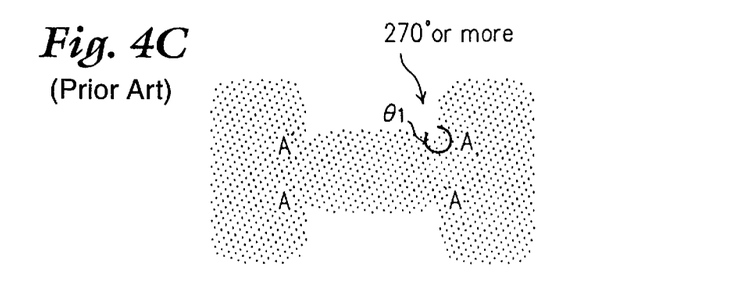
FIG. 4C is a top view of the bump electrode of the conventional transistor device shown in FIG. 4A.

FIGS. 4A, 4B and 4C illustrate a transistor device developed by researchers including the inventor of the present invention and disclosed in H. Sato et al., "Bump Heat Sink Technology", 15th Annual GaAs IC Symposium Technical Digest, pp. 337–340. The transistor device is usable for power amplification in a microwave range. The transistor device described in this publication will be described as a "transistor device 200".

FIG. 4A is a plan view of the transistor device 200, and FIG. 4B is a cross sectional view thereof taken along lines 4B—4B in FIG. 4A.

As shown in FIG. 4A, the transistor device 200 includes a semi-insulative substrate 201 formed of GaAs and a plurality of HBTs 200a (only one is shown in FIG. 4A). As shown in FIG. 4B, each HBT 200a includes a sub-collector layer 211 provided on the substrate 201 and a collector layer 212 provided on the sub-collector layer 211. The collector layer 212 has a smaller area than the sub-collector layer 211. The sub-collector layer 211 has a finger-shaped collector electrode 211a on each of two ends of a surface thereof. The collector electrodes 211a are connected to each other via a collector take-out electrode 211b (FIG. 4A).

The HBT 200a further includes a base layer 213 provided on the collector layer 212 and an emitter layer 214 provided on the base layer 213. The emitter layer 214 has a smaller area than the base layer 213. The base layer 213 has a finger-shaped base electrode 213a on each of two ends of a surface thereof. The base electrodes 213a are connected to each other via a base take-out electrode 213b (FIG. 4A). The emitter layer 214 has an emitter electrode 214a thereon.

The transistor device 200 includes a wire layer 215 so as to cover the HBT 200a in a direction crossing the collector electrodes 211a and the base electrodes 213a (FIG. 4A). An interlevel insulative layer 217a is provided between the HBT 200a and the wire layer 215. The emitter electrode 214a is connected to the wire layer 215.

The transistor device 200 further includes a bump electrode 216 on the wire layer 215. The bump electrode 216 extends from an area above the sub-collector layer 211 toward two opposite directions substantially parallel to the wire layer 215.

The transistor device 200 further includes interlevel insulative layers 217b provided between the sub-collector layer 211 and the finger-shaped collector electrodes 211a, and interlevel insulative layers 217c provided between the base layer 213 and the finger-shaped base electrodes 213a.

Figure 5A:
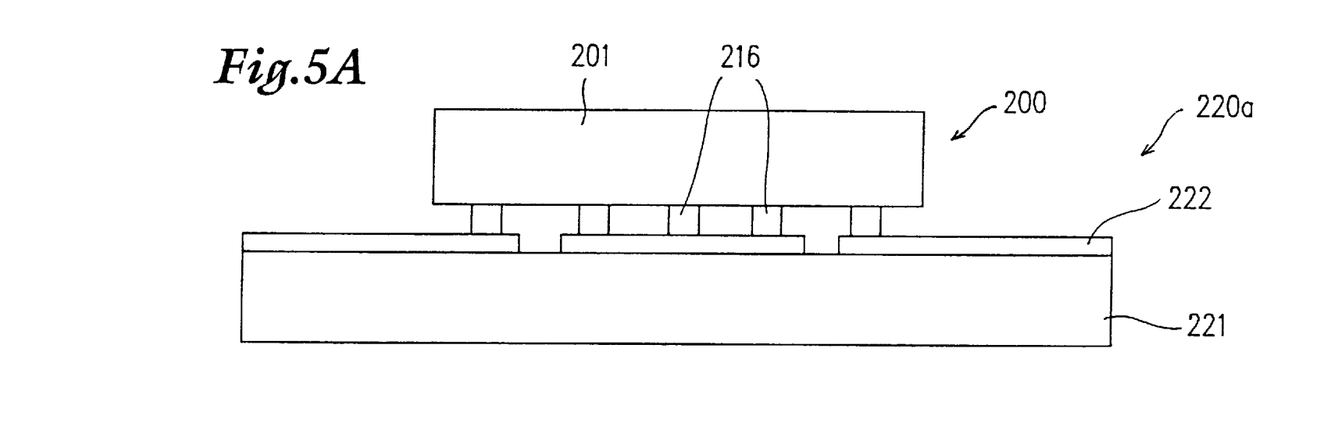
FIG. 5A is a side view of a semiconductor device including a transistor device.

FIG. 5A is a cross sectional view of a semiconductor device 220a (for example, an MMIC) including the transistor device 200 mounted by flip-chip mounting on an AlN substrate 221 (mounting substrate) which has a Au wire 222 thereon patterned as prescribed.

Figure 5B:
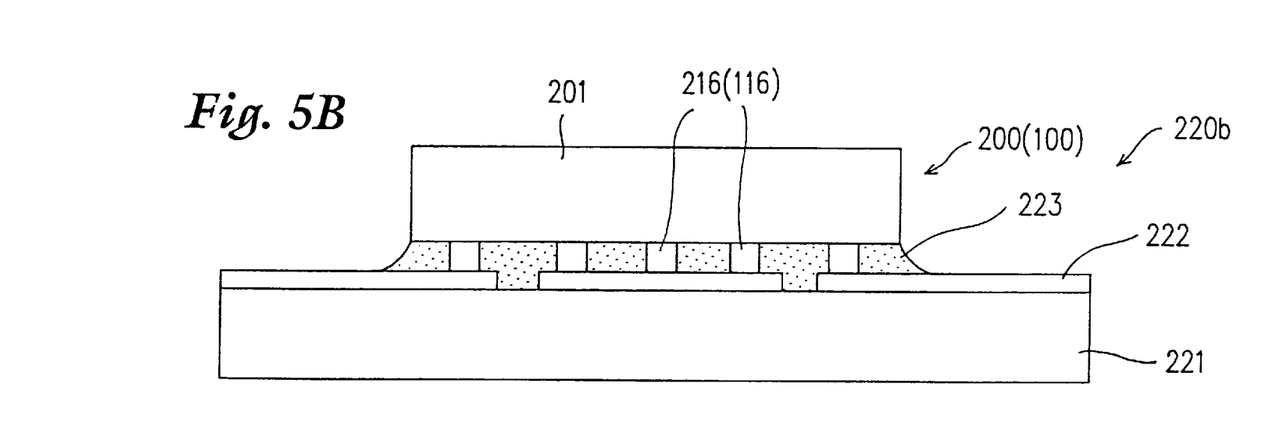
FIG. 5B is a side view of another semiconductor device including a transistor device.

FIG. 5B shows a cross section of another conventional GaAs semiconductor device 220b developed by researchers including the inventor of the present invention which is disclosed in Japanese Laid-Open Patent Publication No. 6-349846. The GaAs semiconductor device 220b includes a resin 223 injected into a space between the AlN substrate 221 and the substrate 201 of the transistor device 200.

The collector electrodes in the vertical-type transistors in both of the above-described conventional examples each may have a width of about 1.8 μm although not clearly described in the above publications.

The above-described conventional semiconductor devices have the following problems.

(1) The transistors and the semiconductor chips are usually covered with an insulative thin layer substantially entirely except for scribe lines and pads of the wafer. In the case where the semiconductor chip includes a GaAs substrate, an insulative thin layer is formed of $SiN_x$ or $SiO_xN_y$ by plasma CVD or the like. Such an insulative thin layer tends to crack when the semiconductor chip is bonded to an AlN substrate or the like. Such cracking causes a significant reduction in the moisture resistance of a semiconductor chip sealed only by a resin, although a semiconductor device sealed by hermetic sealing is not significantly influenced by the cracking.

(2) As shown in FIG. 4A, the bump electrode 216 has a substantially H-shaped shape as seen from above and is formed by, for example, photolithography. In practice, however, as shown in FIG. 4C, areas A are partially eroded, causing angle $\theta_1$ to be more than 270° C. As a result, repeatability of the area of the bump electrode 216 is reduced. The repeatability of dependency of the degree of deformation of the bump electrode 216 on the pressure applied while bonding is also reduced. For these reasons, the bonding yield is lowered. Furthermore, the resultant shape of the bump electrode 216 with interior angles exceeding 270° increases the residual stress in the bump electrode 216. In a structure where the transistor is located just below the bump electrode 216, the residual stress applied to the transistor is excessive. Accordingly, the emitter electrode is peeled off in the case of an emitter-up structure, and the collector electrode is peeled off in the case of a collector-up structure. The amount of residual stress changes the degree of shift in characteristics of the transistor after the bonding. Moreover, the above-described cracking in the insulative thin layer is also promoted.

Figure 6:
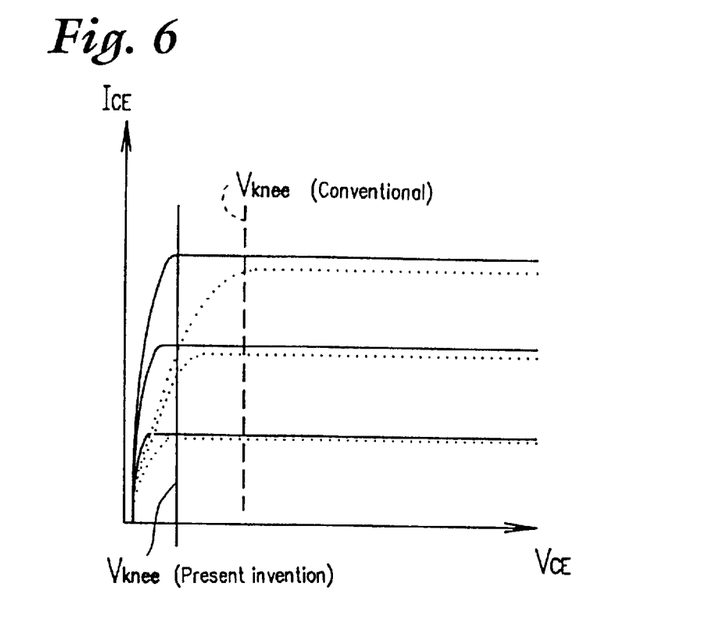
FIG. 6 is a graph comparing the Knee voltages of the conventional transistor and a transistor shown in FIG. 1A.

(3) The conventional vertical-type transistor has an excessively high collector resistance. Accordingly, it is difficult to effectively reduce the Knee voltage $V_{Knee}$ (FIG. 6).

For the above-described reasons, there is conventionally no high-performance HBTs or semiconductor devices usable for power amplification in a microwave and milliwave range at reasonable cost.

SUMMARY OF THE INVENTION

According to one aspect of the invention, a vertical-type transistor device includes a transistor unit provided on a surface of a substrate, the transistor unit extending in a first direction; and a bump electrode provided above the transistor unit, the bump electrode crossing the transistor unit in a second direction perpendicular to the first direction. The bump electrode has a first area positionally corresponding to the transistor unit and a second area positionally non-corresponding to the transistor unit, and a size of the second area in the first direction is greater then the size of the first area in the first direction. The bump electrode has a shape with no interior angle exceeding 270° as seen from above.

In one embodiment of the invention, the bump electrode is butterfly-shaped and further has another second area positionally non-corresponding to the transistor unit and two third areas, the two second areas having the first area therebetween and having a dimension equal to each other in the first direction, the two third areas being located between the second areas and the first area respectively and a size in the first direction changing continuously.

In one embodiment of the invention, the transistor unit is finger-shaped.

According to another aspect of the invention, a vertical-type transistor device having an emitter-up structure includes a collector layer, a base layer, and an emitter layer stacked sequentially in this order and collectively extending in a first direction; an emitter electrode electrically connected to the emitter layer; two collector electrodes electrically connected to the collector layer; and a take-out electrode connected to the emitter electrode, the take-out electrode extending in a second direction perpendicular to the first direction from a top area of the emitter electrode and partially surrounding the collector electrodes so as to have the collector electrodes therebetween the ends thereof. The collector electrodes each have a width in the range between 5 µm to 10 µm in the second direction.

According to still another aspect of the invention, a vertical-type transistor device having a collector-up structure includes an emitter layer, a base layer, and a collector layer stacked sequentially in this order and collectively extending in a first direction; a collector electrode electrically connected to the collector layer: two emitter electrodes electrically connected to the emitter layer; and a take-out electrode connected to the collector electrode, the take-out electrode extending in a second direction perpendicular to the first direction from a top area of the collector electrode and partially surrounding the emitter electrodes so as to have the emitter electrodes therebetween the ends thereof. The emitter electrodes each have a width in the range between 5 µm to 10 µm in the second direction.

In one embodiment of the invention, the take-out electrode is arch-shaped.

According to yet another aspect of the invention, a semiconductor device includes .a semiconductor substrate; and at least one above-described vertical-type transistor device usable for power amplification, the at least one vertical-type transistor device being mounted on the semiconductor substrate in a monolithic manner.

According to yet another aspect of the invention, a semiconductor device includes a semiconductor chip including at least one transistor; an insulative thin layer for protecting a surface of the semiconductor chip; a wire layer electrically connected to a part of the transistor through an opening in the insulative thin layer; and a bump electrode formed above the wire layer, the bump electrode being plastically deformable for connecting the semiconductor chip to a mounting substrate. The opening in the insulative thin layer has an inner contour surrounding the bump electrode with a gap which, when seen from above, is 1.5 µm or less.

According to yet another aspect of the invention, a semiconductor device includes a semiconductor chip including at least one transistor; an insulative thin layer for protecting a surface of the semiconductor chip; a wire layer electrically connected to a part of the transistor through an opening in the insulative thin layer; and a bump electrode formed on the wire layer, the bump electrode being plastically deformable for connecting the semiconductor chip to a mounting substrate. The opening in the insulative thin layer has an inner contour partially surrounding the bump electrode with a gap which, when seen from above, is 1.5 µm or less.

In one embodiment of the invention, the bump electrode is formed of a material selected from the group consisting of gold and an alloy including gold.

According to yet another aspect of the invention, a method for producing a vertical-type transistor device including a transistor unit and a bump electrode provided above the transistor unit in a direction perpendicular to a longitudinal direction of the transistor unit includes the step of forming a photoresist layer above the transistor unit to form the bump electrode by photolithography using a light-shielding mask. The light-shielding mask has an opening having a shape corresponding to a shape of the bump electrode, the shape of the opening having no interior angle exceeding 225°.

Thus, the invention described herein makes possible the advantages of providing a high-performance vertical-type transistor having a sufficiently high moisture resistance, a method for producing the same at low cost, and a semiconductor device including such a vertical-type transistor.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

A transistor device 100 in an example according to the present invention will be described with reference to FIGS. 1A and 1B. The transistor device 100 includes a substrate formed of GaAs.

Figure 1A:
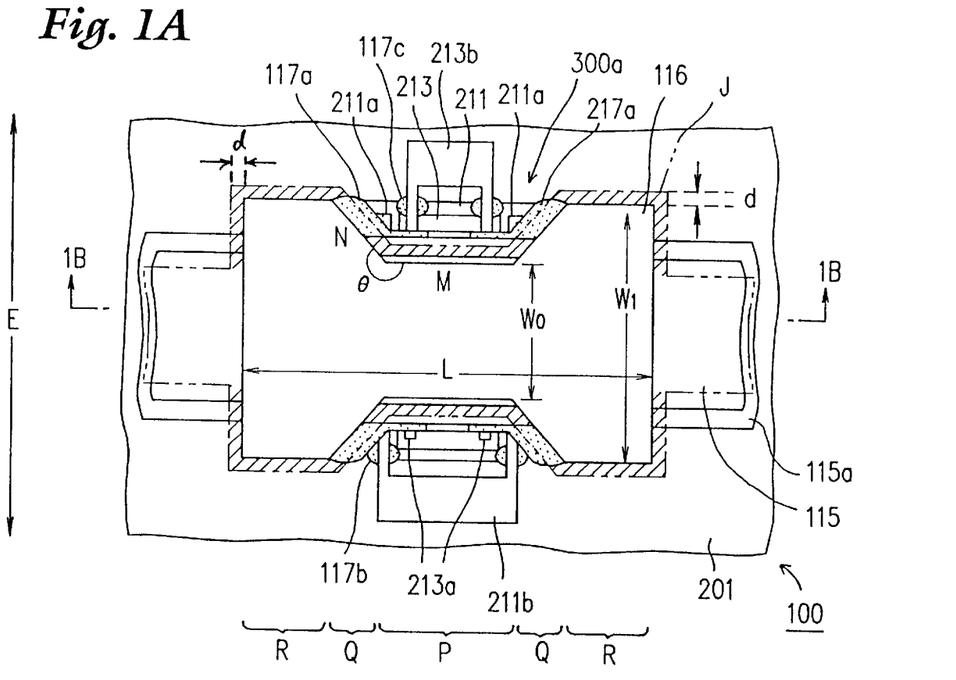
FIG. 1a is a top view of a transistor device in a first example according to the present invention.
Figure 1B:
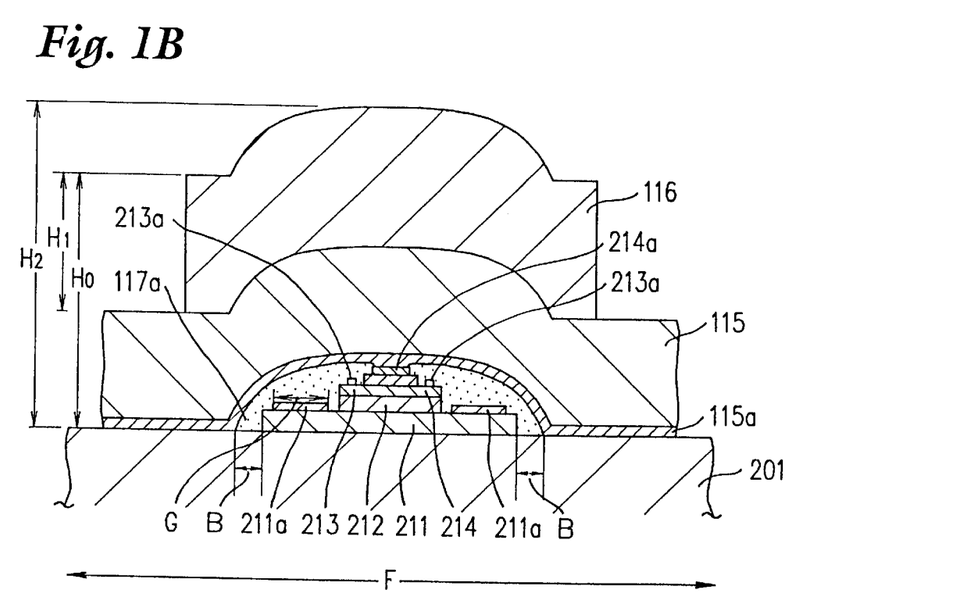
FIG. 1B is a cross sectional view of the transistor device shown in FIG. 1A taken along lines 1B—1B in FIG. 1A.

FIG. 1A is a partial top view of the transistor device 100, and FIG. 1B is a cross sectional view of the transistor device 100 along lines 1B—1B in FIG. 1A. The transistor device 100 is used for power amplification in a microwave range. Identical elements previously discussed with respect to FIGS. 4A and 4B will bear identical reference numerals therewith and the descriptions thereof will be omitted.

As shown in FIGS. 1A and 1B, the transistor device 100 includes a GaAs substrate 201 and a plurality of HBTs 300a (only one is shown in FIG. 1A) of an emitter-up structure. As shown in FIG. 1B, each HBT 300a includes a sub-collector layer 211, a collector layer 212, a base layer 213, a first graded layer (not shown), an emitter layer 214, a second graded layer (not shown), and a cap layer (not shown) provided on the substrate 201 in this order. The HBT 300a further includes finger-shaped collector electrodes 211a provided on the sub-collector layer 211, finger-shaped base electrodes 213a provided above the base layer 213, and an emitter electrode 214a provided on the cap layer. The finger-shaped collector electrodes 211a are connected to each other via a collector take-out electrode 211b, and the finger-shaped base electrodes 213a are connected to each other via a base take-out electrode 213b. In this specification, the expression "finger-shaped" is used to indicate a "lengthy" shape. In this sense, the transistor unit is also "finger-shaped".

A longitudinal direction of the finger-shaped transistor unit (indicated by arrow E in FIG. 1A) is also defined as the "first direction". The direction perpendicular to the first direction (indicated by arrow F in FIG. 1B) is defined as the "second direction". The HBT 300a has a length of about 20 μm in the first direction and a width of about 6.4 μm in the second direction.

The transistor device 100 includes a lower wire layer 115a having a three-layer structure formed of Ti, Pt and Au. The lower wire layer 115a extends from an area just above the emitter electrode 214a in the second direction on the HBT 300a.

An interlevel insulative layer 117a is provided between the lower wire layer 115a and the HBT 300a. Interlevel insulative layers 117b are provided between the sub-collector layer 211 and the collector take-out electrode 211b, and interlevel insulative layers 117c are provided between the base layer 213 and the base take-out electrode 213b. The interlevel insulative layers 117a, 117b and 117c are formed of polyimide.

The transistor device 100 further includes a Ti/Au layer (not shown) provided on the lower wire layer 115a, and a bump electrode 115 provided on the Ti/Au layer.

As shown in FIG. 1A, the bump electrode 116 is substantially butterfly-shaped and is formed by gold-plating. The bump electrode 115 has a central area P corresponding to the transistor unit of the HBT 300a and having size $W_0$ in the first direction, two external areas R having size $W_1$ in the first direction, and two intermediate areas Q connecting the central area P and the two external areas R. The two intermediate areas Q each has an outwardly tapered shape having two slanting sides. The size of the bump electrode 116 in the second direction is represented by letter L in FIG. 1A. Size L is about 56 μm when the bump electrode 116 is completed. In this example, size $W_0$ of the central area P is about 16 μm, and size $W_1$ of the external areas is about 26 μm. Angle $\theta_2$ made by horizontal side M of the central area P and slanting side N of the intermediate area Q is in the range between 180° and 270°. Each of the finger-shaped collector electrodes 211a preferably has a width of about 5 to 10 μm. In this example, the width of the collector electrode 211a is about 6 μm.

The lower wire layer 115a is insulated from the HBT 300a by the interlevel insulative layer 117a except for being connected to the emitter electrode 214a. Distance B (FIG. 1B) between an outer contour of the interlevel insulative layer 117a on the GaAs substrate 201 and an end of the sub-collector layer 211 is set to be 2 to 7 μm. If distance B is less than 2 μm, the subcollector layer 211 is not sufficiently protected against shortcircuiting during bonding; and if distance B is more then 7 μm, a satisfactory bonding strength cannot be obtained.

As illustrated in FIG. 1B, an area of the bump electrode 116 corresponding to the transistor unit of the HBT 300a and the interlevel insulative layer 117a covering the HBT 300a projects upward in a slow curve. The bump electrode 116 has height Ha of about 33 μm from the surface of the substrate 201 at the highest point and height $H_0$ of about 30 μm. Height $H_1$, which is the height of the bump electrode 116 in the state of being mounted on an AlN substrate or the like, is about 20 μm. Such a projection of the bump 116 guarantees the flip-chip connection during bonding (described below). When the transistor device 100 is mounted on an AlN substrate or the like, the bonding pressure causes the bump electrode 116 to expand. As a result, size $W_0$ (about 16 μm) of the bump electrode 116 becomes substantially equal to size $W_1$ (about 20 μm) of the HBT 300a.

An insulative thin layer (not shown) formed of SiN is provided on the lower wire layer 115a. The insulative thin layer acts as both an MIM film and a passivation film. The insulative thin layer has an opening in correspondence with an area where the bump electrode 116 is to be formed. In more detail, as shown in FIG. 1A, the opening is formed so that a contour thereof (indicated by two-dot chain line, line J in FIG. 1A) surrounds the bump electrode 116. The gap between the insulative thin layer and the bump electrode 116 is indicated by hatching in FIG. 1A except for the areas where the lower wire layer 115a needs to be in contact with the upper wire layer 115. Distance d represents the width of the gap. Distance d between the contour J of the opening and the bump electrode 116 is 1.5 µm or less when measuring the gap as seen from above. If distance d is larger than 1.5 µm, moisture invades below the insulative thin layer as described below.

As shown in FIG. 5B, the semiconductor chip includes a plurality of HBTs 300a arranged parallel (described above in connection with FIGS. 1A and 1B). The semiconductor chip is mounted by flip-chip mounting on an AlN substrate 221 having a metal pattern 222 to produce a semiconductor device 220b. The flip-flop mounting is performed via the bump electrode 116 provided above the semiconductor chip.

Although not shown, a semiconductor device such as an MMIC including a plurality of vertical-type transistors shown in FIG. 1A mounted on an AlN substrate is also available according to the present invention.

As appreciated from the above description, according to the present invention, transistors and circuit blocks having other functions can be formed in a monolithic manner. The area below the semiconductor chip is filled with an epoxy resin for sealing.

Although not shown, the area below the semiconductor chip can be filled with a silicone resin for sealing. As a result of a pressure-cooker test, it has been found that the silicone resin retains less moisture than an epoxy resin.

It is designed that the bump electrode 116 is bonded by a process including a downward pressure to reduce the height by about 13 µm at the highest point and by about 10 µm at the lowest point. Both figures are larger than the difference between height $H_2$ (33 µm) of the highest point and height $H_0$ (30 µm) of the lowest point of the bump electrode 116.

The size of the bump electrode 116 in the second direction which is in contact with the AlN substrate 221 is 56 µm (size L in FIG. 1A). This figure is greater than twice the height $H_1$ (20 µm) of the bump electrode 116 in the state of being mounted.

Hereinafter, a method for producing the HBT 300a will be described.

The HBT 300a having an npn emitter-up structure is formed using AlGeAs/GaAs materials by a known method (for example, a method described in H. Sato et al., "Carbon-doped AlGaAs/GaAs HBTs with $f_{MAX}$=117 GHz grown by MOCVD", Technical Report of the Institute of Electronics, Information and Communication Engineers, ED90-135, pp. 19–24, Jan. 17, 1991.

The HBT 300a is formed by the same method as described in the above-identified thesis except for the sub-collector layer 211 (referred to as the "buffer" in the above thesis) which is formed of n⁻-GaAs with an impurity concentration of $5 \times 10^{18}$ cm$^{-3}$ and has a thickness of 500 nm.

In detail, the sub-collector layer 211 (thickness: 500 nm) is first formed on the GaAs substrate 201. Then, the layers described below are sequentially formed on the sub-collector layer 211. The layers formed on the sub-collector layer 211 are: the collector layer 212 formed of GaAs with an n-type impurity concentration of $5 \times 10^{16}$ cm$^{-3}$ and having a thickness of about 400 nm, the base layer 213 formed of GaAs with a p-type impurity concentration of $4 \times 10^{19}$ cm$^{-3}$ and having a thickness of about 8 nm, the first graded layer (not shown) formed of Al$_x$Ga$_{1-x}$As with an n-type impurity concentration of $5 \times 10^{17}$ cm$^{-3}$ and having a thickness of about 20 nm, the emitter layer 214 formed of Al$_{0.29}$Ga$_{0.71}$As with an n-type impurity concentration of $5 \times 10^{17}$ cm$^{-3}$ and having a thickness of about 100 nm, the second graded layer (not shown) formed of Al$_x$Ga$_{1-x}$As with an n-type impurity concentration of $5 \times 10^{17}$ cm$^{-3}$ and having a thickness of about 20 nm, and a cap layer (not shown) formed of GaAs with an n-type impurity concentration of $2 \times 10^{18}$ cm$^{-3}$ and having a thickness of about 200 nm. The value of x in the first graded layer continuously changes from 0 to 0.29. The value of x of the second graded layer continuously changes from 0.29 to 0.

Then, the layers are etched to have a mesa as shown in FIG. 1B, and then the collector electrodes 211a, the base electrode 213a and the emitter electrode 214a are formed. The collector electrodes 211a are formed of, for example, AuGe/Ni/Au (100/15/100 nm). The base electrode 213a is formed of, for example, Ti/Pt/Au (50/50/60 nm). The emitter electrode 214a is formed of, for example, WN/Ti/Pt/Au (100/50/50/50 nm). Then, alloying treatment is performed.

After the HBT 300a is formed as shown in FIG. 1B, the interlevel insulative layers 117a, 117b and 117c are formed of polyimide. The interlevel insulative layer 117a is formed so as to cover the collector electrodes 211a and the base electrodes 213a. The interlevel insulative layer 117a has an opening to electrically connect the emitter electrode 214a and the lower wire electrode 115a which will be formed later.

After the collector electrodes 211a and the base electrodes 213a are covered with the interlevel insulative layer 117a, the lower wire electrode 115a, the collector take-out electrode 211b and the base take-out electrode 213b are formed by depositing Ti, Pt and Au sequentially. The lower wire electrode 115a is formed on the emitter electrode 214a and the interlevel insulative layer 117a. The lower wire layer 115a is used as a take-out electrode for the emitter electrode 214a. The collector take-out electrode 211b and the base take-out electrode 213b are located relatively far from the transistor unit of the HBT 300a.

Then, an insulative thin layer (not shown) acting as both a passivation film and an MIM film is formed of SiN$_x$ and treated with photolithography and etching using buffered hydrogen fluoride to form an opening positionally corresponding to the bump electrode 116 (formed later) and an area in which the lower wire layer 115a needs to be in contact with the upper wire layer 115 (formed later). The opening is formed so that a contour thereof (indicated by two-dot chain line, line J in FIG. 1A) surrounds the bump electrode 116. The gap between the insulative thin layer and the bump electrode 116 is indicated by hatching in FIG. 1A except for the areas where the lower wire layer 115a needs to be in contact with the upper wire layer 115. Distance d represents the width of the gap. Distance d between the contour J of the opening and the bump electrode 116 is 1.5 µm or less when measuring the gap as seen from above.

Thereafter, the upper wire layer 115 is formed in the following manner.

First, a positive photoresist for smoothing the surface (not shown) is formed over the entire surface of the substrate 201, and an opening is formed by photolithography in an area where the upper wire layer 115 is to be formed. The photoresist used for smoothing the surface will be referred to as the "surface-smoothing photoresist".

Next, Ti and Au are sequentially vapor-deposited over the substrate 201 in thicknesses of 50 nm and 100 nm respectively, so as to cover the surface-smoothing photoresist. Thus, the two-layer electrode (not shown) is formed.

The two-layer electrode is used for plating. A positive photoresist used for plating of, for example, a novolak resin, is formed on the two-layer electrode, and an opening is formed by photolithography in an area where the upper wire layer 115 is to be formed. Then, the upper wire layer 115 is formed by plating Au to a thickness of about 10 μm. The photoresist used for plating will be referred to as the "plating photoresist".

The plating photoresist is removed. Then, the Au layer is etched with a mixture solution of iodine and ammonium iodide to be left only in the opening of the surface-smoothing photoresist. The Ti layer is also etched with buffered hydrogen fluoride to be left only in the opening of the surface-smoothing photoresist. Etching using buffered hydrogen fluoride is advantageous for causing less damage to the layer pattern due to supersonic washing and also for requiring a fewer number of steps, compared with a lift-off method using a surface-smoothing photoresist.

Next, the surface-smoothing photoresist is removed. If the surface-smoothing photoresist is not removed at this stage, the surface-smoothing photoresist is baked again during the formation of the bump electrode 116 and thus becomes more difficult to remove. Under the conditions where the surface-smoothing photoresist is removed after being baked again, the bump electrode 115 can be formed with the surface-smoothing photoresist left on the lower wire layer 115a. In such a case, the time and trouble for removing the surface-smoothing photoresist can be saved.

The surface-smoothing photoresist and the plating photoresist are soluble in different solvents.

There are two methods for providing the photoresists with such different properties.

(Method 1)

The surface-smoothing photoresist and the plating photoresist are formed of different materials. In particular, the surface-smoothing photoresist is formed of, for example, SAL110 (produced by Shipley Far East Ltd.), which is developed, exposed and hard-baked at a temperature of 230° C. The plating photoresist is formed of, for example, PMER AR900 (produced by Tokyo Ohka Kogyo Co., Ltd.).

(Method 2)

The two photoresists are treated with different baking conditions after being applied. In particular, the surface-smoothing photoresist is formed of OFPR800 (produced by Tokyo Ohka Kogyo Co., Ltd.), which is developed, exposed and then hard-baked at about 200° C. The hard-baking step has an effect of rounding the edges of the photoresist layer by reflow to smooth the surface. The plating photoresist is formed of PMER AR900, which is baked at a temperature of 80° C. for a shorter period of time than hard-baking.

By such treatment, the plating photoresist can be removed only when washed with an organic liquid. The surface-smoothing photoresist can be removed only by an OMR liquid.

Due to such different properties of the two photoresists, even if the opening is formed in the plating photoresist with a positional error, defective exposure or development, or the like, only the plating photoresist can be removed to start the formation process from the formation of the plating photoresist alone. If the two photoresists do not have such different properties, when the plating photoresist is dissolved, the surface-smoothing photoresist is also dissolved. As a result, the Ti and Au layers are partially lifted off, in which case it is impossible to start the formation process only from the formation of the plating photoresist.

After the upper wire layer 115 is formed in this manner, the bump electrode 116 is formed in the following manner.

First, a surface-smoothing positive photoresist (not shown) is formed over the entire surface of the substrate 201, and an opening is formed by photolithography in an area where the bump electrode 116 is to be formed.

Next, Ti and Au are sequentially vapor-deposited over the substrate 201 in thicknesses of 50 nm and 100 nm respectively, so as to cover the surface-smoothing photoresist. A plating-resistant positive photoresist of, for example, a novolak resin, is formed on the Au film, and an opening is formed by photolithography in an area where the bump electrode 116 is to be formed. Then, a Au layer is formed by plating to a thickness of about 20 μm. Thus, the bump electrode 116 shown in FIGS. 1A and 1B is formed.

The plating photoresist is removed. Then, the Au layer is etched with a mixture solution of iodine and ammonium iodide to be left only in the opening of the surface-smoothing photoresist. The Ti layer is also etched with buffered hydrogen fluoride to be left only in the opening of the surface-smoothing photoresist. Etching using buffered hydrogen fluoride is advantageous for causing less damage to the layer pattern due to supersonic washing and also for requiring a fewer number of steps, compared with a lift-off method using a surface-smoothing photoresist.

The surface-smoothing photoresist and the plating photoresist are soluble in different solvents.

There are two methods for providing the photoresists with such different properties.

(Method 1)

The surface-smoothing photoresist and the plating photoresist are formed of different materials. In particular, the surface-smoothing photoresist is formed of, for example, SAL110 (produced by Shipley Far East Ltd.), which is developed, exposed and hard-baked at a temperature of 230° C. The plating photoresist is formed of, for examples PMER AR900 (produced by Tokyo Ohka Kogyo Co., Ltd.).

(Method 2)

The two photoresists are treated with different baking conditions after being applied. In particular, the surface-smoothing photoresist is formed of OFPR800 (produced by Tokyo Ohka Kogyo Co., Ltd.), which is developed, exposed and then hard-baked at about 200° C. The hard-baking step has an effect of rounding the edges of the photoresist layer by reflow to smooth the surface. The plating photoresist is formed of PMER AR900, which is baked at a temperature of 80° C. for a shorter period of time than hard-baking.

By such treatment, the plating photoresist can be removed only when washed with an organic liquid. The surface-smoothing photoresist can be removed only by an OMR liquid.

Due to such different properties of the two photoresists, even if the opening is formed in the plating photoresist with a positional error, defective exposure or development, or the like, only the plating photoresist can be removed to start the formation process from the formation of the plating photoresist alone. If the two photoresists do not have such different properties, when the plating photoresist is dissolved, the surface-smoothing photoresist is also dissolved. As a result, the Ti and Au layers are partially lifted off, in which case it is impossible to start the formation process only from the formation of the plating photoresist.

Figure 2:
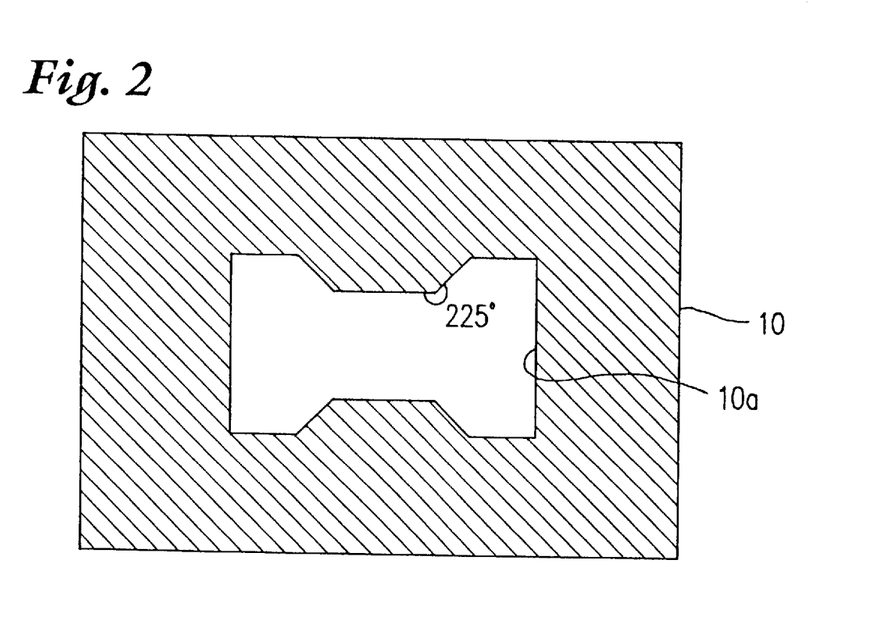
FIG. 2 is a top view of a photomask used for forming a bump electrode of the transistor device shown in FIG. 1A.
Figure 3:
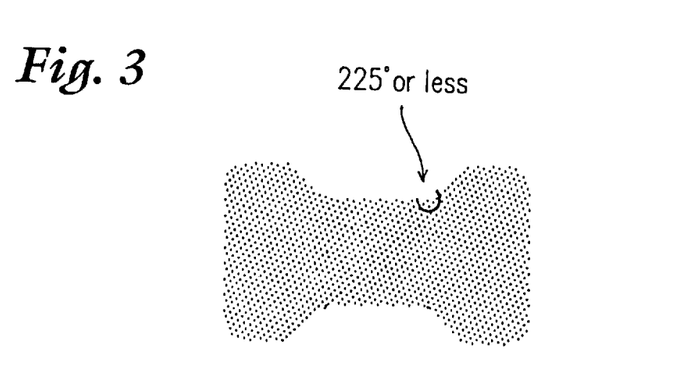
FIG. 3 is a top view of the bump electrode formed using the photomask shown in FIG. 2.

FIG. 2 is a plan view of a photomask (light-shielding mask formed of, for example, chrome) 10 used for forming the bump electrode 116 described above in connection with FIGS. 1A and 1B, and FIG. 3 is a plan view of the bump electrode formed using the photomask 10. The mask 10 used in this example has an opening 10a with no interior angle exceeding 225°. The opening in the surface-smoothing photoresist and the opening in the plating photoresist are formed to finally have the same shape even if the two photoresists have different light-sensitive properties. In detail, an opening of a photomask used for forming the opening in the plating photoresist is smaller than an opening of a photomask used for forming the opening in the surface-smoothing photoresist by 2 μm all around the contour thereof. Such a difference in size (2 μm) can be optimized in accordance with the method used for forming the bump electrode and the shape of the bump electrode.

After the remaining photoresist is entirely removed, lapping (polishing of the bottom surface of the wafer) and dicing are performed by a known method to produce the transistor device 100. Lapping, which is performed to facilitate the dicing, is not necessarily required.

The transistor device 100 obtained in this manner is bonded on an AlN substrate having a metal pattern formed thereon using a flip chip bonder. Bonding is performed using a pulse-heat system in order to reduce the heat applied to the transistor device 100 to a minimum possible temperature. The pressure, temperature and heating time are adjusted so that the height of the bump electrode 116 is reduced by bonding by about 10 μm. In this example, the pressure is 2.2 kg, the temperature is 385° C., and the heating time is 5 seconds.

By such bonding, the bump electrode is changed in size. After the bonding, size $W_0$ is 19 μm, and size L is 59 μm. The distance between the transistor device 100 and the AlN substrate is 20 μm.

Next, an epoxy resin containing no filler is applied to a tip of the transistor device 100 in a small amount. The epoxy resin goes between the transistor device 100 and the AlN substrate by a capillary phenomenon, thereby avoiding the introduction of air bubbles. A silicone resin can be used in lieu of the epoxy resin.

Thereafter, the transistor device 100 mounted on the AlN substrate is heated at 150° C. for 2 hours in a nitrogen atmosphere to cure the resin.

In this example, the vertical-type transistor has an emitter-up structure including the collector, the bass and the emitter stacked in this order. Needless to say, the present invention is applicable to a collector-up vertical-type transistor having an emitter, an base and a collector stacked in this order. The conductivity type of each semiconductor layer also can be inverted.

As described above, each of the external areas R of the bump electrode 116 which does not correspond to the transistor unit of the HBT 300a has size $W_1$, which is larger than size $W_0$ of the central area thereof corresponding to the transistor unit of the HBT 300a as in the conventional examples. Furthermore, according to the present invention, the shape of the bump electrode 116 as seen from above does not have any interior angle exceeding 270°.

Due to such a shape of the bump electrode 116, a residual stress in the bump electrode 116 after the transistor device 100 is bonded to the AlN substrate is smaller than in the case where the bump electrode has an interior angle exceeding 270°. As a result, the following effects can be achieved.
(1) The cracking easily generated in the insulative thin layer when the bump electrode has interior angles exceeding 270° can be prevented.
(2) In the structure where the transistor is located just below the bump electrode 116 as in this example, the residual stress applied on the transistor after bonding is reduced. Accordingly, the defect that the top electrode (namely, the emitter electrode in an emitter-up structure, and the collector electrode in a collector-up structure) is peeled off can be prevented. Moreover, the change in characteristics of the transistor or the MMIC after bonding caused by the residual stress can be minimized.

As described above with reference to FIGS. 2 and 3, the mask 10 used for photolithography in forming the bump electrode 116 as described above and shown in FIGS. 1A and 1B has the opening 10a which does not have any interior angle exceeding 225°. Such a shape of the mask 10 has the following effect.

In order to form the bump electrode 116 having the sizes defined in this example, a negative photoresist does not provide satisfactory resolution. Even a most appropriate positive photoresist available today provides barely sufficient resolution to form the bump electrode 116 having the above-defined sizes. Such a level of resolution does not provide sufficient repeatability. The inventor of the present invention has found that a use of a mask with an opening having interior angles barely within 270° results in formation of a bump electrode having interior angles exceeding 270° (FIG. 4C). The reason is that the areas A of the bump electrode are eroded within the area covered by the photomask. The degree of such erosion is not repeatable and thus varies lot by lot.

In the case where the mask 10 has the opening 10a which has interior angles of 225°, the above-described problem does not occur. Thus, the largest interior angle of the bump electrode 116 can be within 225°. Since it is desirable to change the angle of the photomask every 45° in terms of size precision and production cost, the photomask 10 having the opening 10a having interior angles of 225° or less is used. By using such a mask, the interior angle of the bump electrode 116 exceeding 180° is not increased to over 270°. As a result, the following effects can be obtained.
(1) The bump electrode 116 can be mass-produced with the same size and shape. The degree of deformation the bump electrode 116 with respect to the pressure applied thereto is maintained the same. Accordingly, bonding yield is improved.
(2) The bump electrode 116 having no interior angle exceeding 270° can be formed with no rise in production cost.

The butterfly shape of the bump electrode 116 in which size $W_1$ is larger than size $W_0$ is advantageous in having a fewer number of interior angles exceeding 180° than in the conventional example.

As shown in FIG. 1B, the take-out electrode for connecting the top electrode (emitter electrode in the emitter-up structure and collector electrode in the collector-up structure) to an external device extends in an arch shape in the second direction (arrow F in FIG. 1B) so as to be over the bottom electrodes (collector electrodes in the emitter-up structure and emitter electrodes in the collector-up structure). Due to such a structure, as the bottom electrodes have a larger width (G in FIG. 1B), the emitter-collector capacitance ($C_{EC}$) increases.

However, in a vertical-type transistor having a bump electrode extending from a top area of the emitter electrode in a direction perpendicular to the longitudinal direction of the transistor unit (i.e., extending in the second direction), when the bottom electrode (collector electrode in an emitter-up structure and emitter electrode in a collector-up structure) has a greater width (size in the second direction), the bonding strength in lowered.

In order to avoid such a problem, the bottom electrode conventionally has a width of 2 μm or less. In contrast, the inventor of the present invention has found by experiments that the resistance of the bottom electrode can be reduced without sacrificing the high-frequency characteristics of the transistor and without restricting the width of the bottom electrode.

Figure 7:
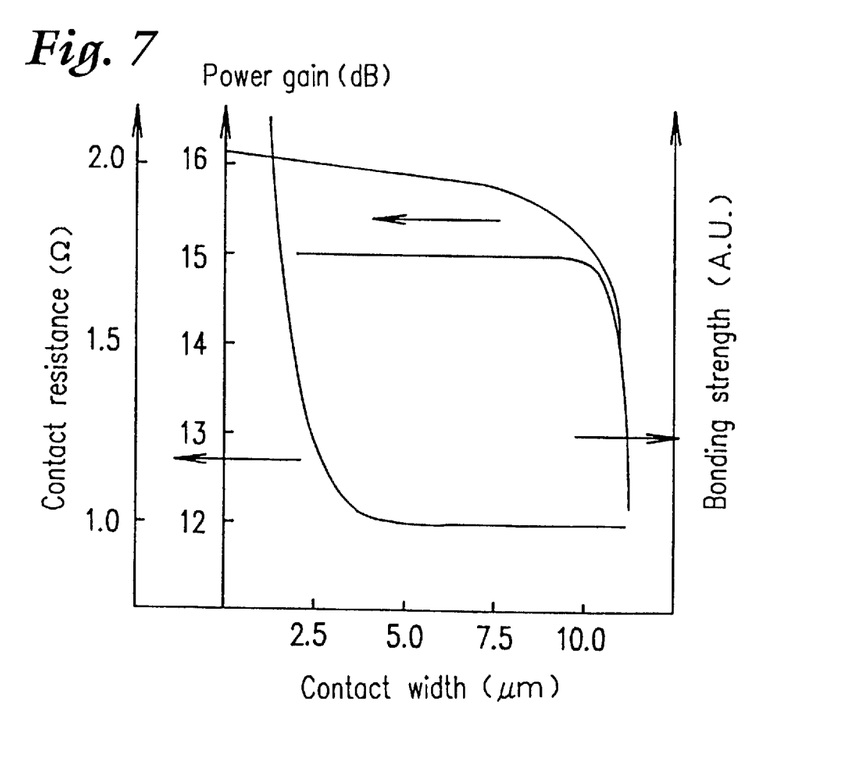
FIG. 7 is a graph illustrating the contact resistance and the bonding strength with respect to the contact width.

FIG. 7 shows the contact resistance and the bonding strength with respect to the contact width (G in FIG. 1B) of the bottom electrode. When the contact width increases from 2 μm to 5 μm, the contact resistance is significantly reduced; whereas the bonding strength is kept in a tolerable range although being slightly lowered when the contact width is between 5 μm to 10 μm. Although not shown, the cut-off frequency ft which is used as the index of the high-frequency characteristics is maintained substantially the same.

In the case of a vertical-type transistor according to the present invention, the bonding strength is kept in the tolerable range when the contact width is between 5 μm to 10 μm.

The ON-resistance of the transistor can be approximately represented by the sum of the emitter resistance and the collector resistance. Accordingly, in the case where the bottom electrode has a contact width in the range of 5 μm to 10 μm, the Knee voltage $V_{Knee}$ can be effectively reduced as indicated by solid lines in FIG. 6. Such a characteristic is advantageous in providing a transistor and an MMIC used for a power linear amplifier, which needs to operate linearly with a large amplitude.

The transistor device 100 in this example is mounted on the substrate by plastic deformation of the bump electrode 116 formed of gold or an alloy including gold. The transistor or the MMIC chip in this example are covered with an insulative thin layer almost entirely except for scribe lines, pads, and the upper wire layer. As described above, the opening of the insulative thin layer is formed so that the contour of the opening is away from the bump electrode 116 by 1.5 μm or less when measured from above (FIG. 1A). Such a structure has the following effects.

Figure 8:
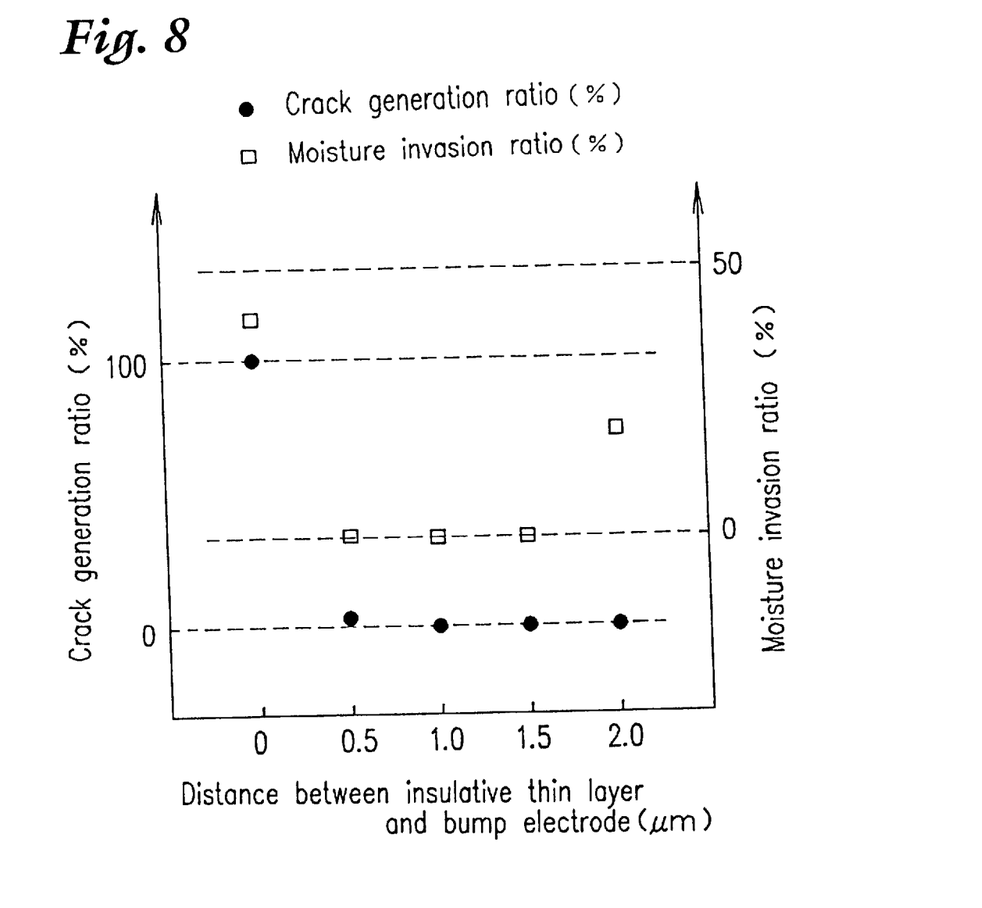
FIG. 8 is a graph illustrating the crack generation ratio and the moisture invasion ratio with respect to the horizontal distance between the insulative thin layer and the bump electrode.

As described above, in the case where an insulative thin layer exists below the upper wire layer 115 even partially, the insulative thin layer tends to crack. FIG. 8 is a graph illustrating the crack generation ratio and the moisture invasion ratio with respect to the distance d (FIG. 1A) between an edge of the opening in the insulative thin layer and an edge of the bump electrode. When the distance is 1.5 μm or less, no crack is generated, or moisture does not invade below the insulative thin layer as a result of a pressure-cooker test. When the distance is more than 1.5 μm, no crack is generated but it is found by the pressure-cooker test that moisture invades onto the surface of the semiconductor chip below the insulative thin layer. Accordingly, the distance d between the insulative thin layer and the bump electrode is preferably between 0 (exclusive) and 1.5 μm (inclusive) in preventing both generation of cracks and moisture invasion and thus realizing a transistor having a higher moisture resistance and a higher performance.

The transistor device 100 in the first example has the upper wire layer 115, but a transistor device having no upper wire layer can also be used for power amplification.

EXAMPLE 2

Figure 9:
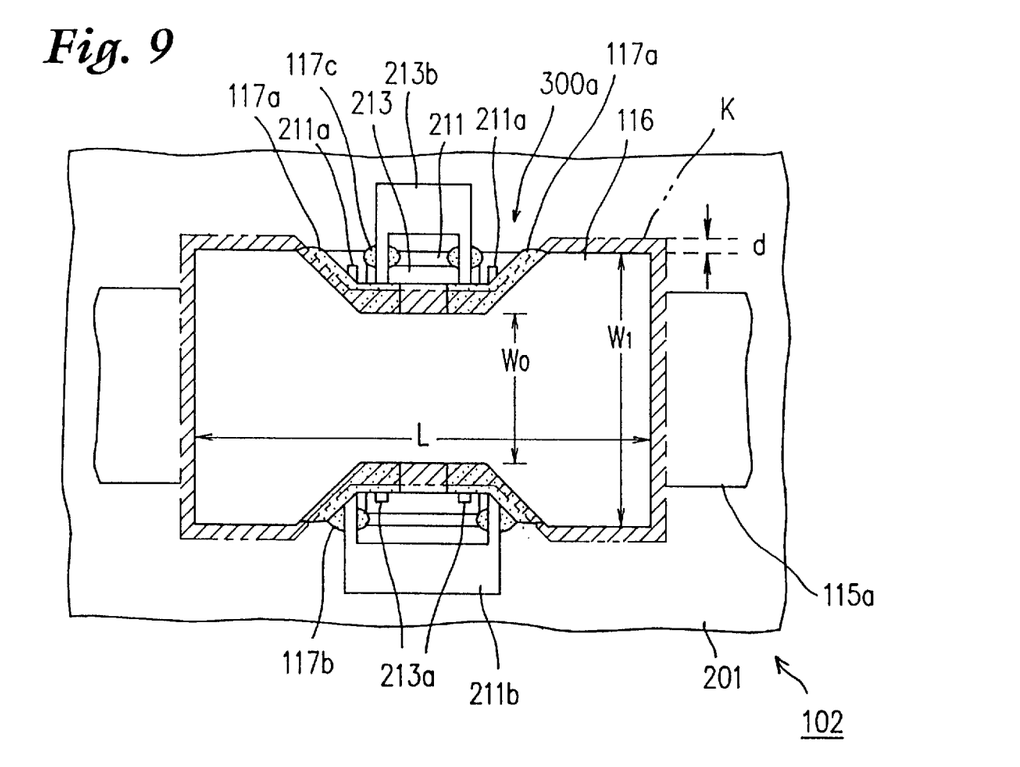
FIG. 9 is a top view of a transistor device in a second example according to the present invention.

FIG. 9 is a top view of a transistor device 102. The transistor device 102 includes the same GaAs HBT 300a of an npn emitter-up structure as in the first example. The transistor device 102 is also usable for power amplification in a microwave range, but does not include an upper wire layer identical elements as those in the first example will bear identical reference numerals therewith and the descriptions thereof will be omitted.

In this example also, the insulative thin layer formed of, for example, SiN and acting as both a passivation film and an MIM film has an opening so as to surround the bump electrode 116. There is a gap indicated by hatching in FIG. 9 between the contour of the opening (indicated by K) and the bump electrode 116, and the distance d of the gap as seen from above is 1.5 μm or less. In this example, the contour of the opening completely surrounds the bump electrode 116. Such a structure of the insulative thin layer can also be formed in the transistor device 100 in the first example including the upper wire layer 115. In such a case, the upper wire layer 115 and the lower wire layer 115a can contact each other through the opening of the insulative thin layer formed in correspondence with the bump electrode 116.

The transistor device 102 in the second example has the same effects as those of the transistor device 100 in the first example.

Figure 10A:
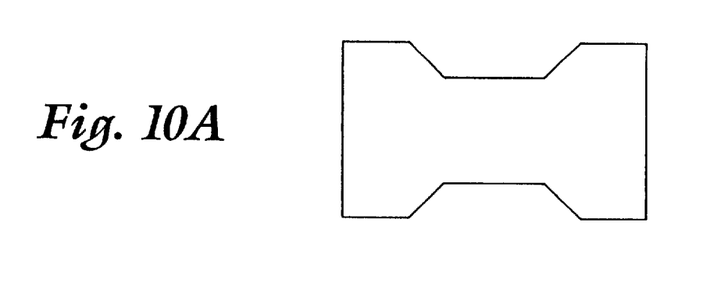
FIGS. 10A through 10D show various shapes for a bump electrode according to the present invention.
Figure 10B:
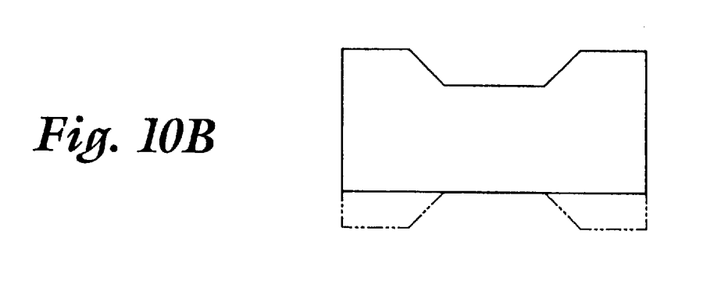
Figure 10C:
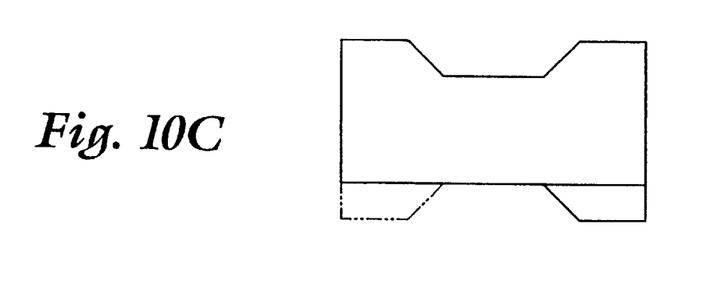
Figure 10D:
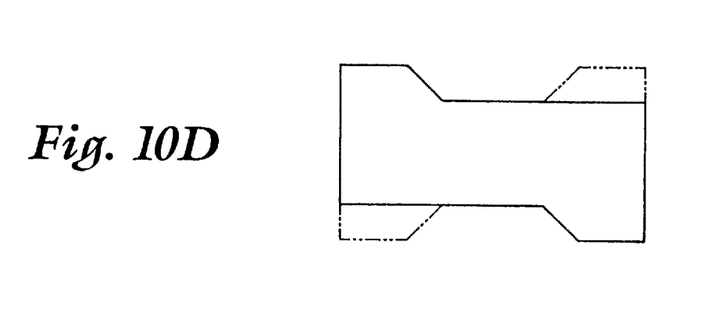

In the, first and the second examples, the bump electrode 116 is butterfly-shaped as shown in FIG. 10A. The bump electrode can have other shapes as shown in FIGS. 10B, 10C and 10D. In FIG. 10B, two bottom projections are omitted as indicated by the two-dot chain lines. In FIG. 10C, one of the two bottom projections is omitted as indicated by the two-dot chain line. In FIG. 10D, one of the two bottom projections and one of two top projections are omitted as indicated by the two-dot chain lines.

In the first and the second examples, the HBT 300a is a single hetero-junction bipolar transistor (SHBT) in which only the emitter has a wider bandgap than the bandgap of the base or the collector. A double hetero-junction bipolar transistor (DHBT), in which the emitter and the collector each have a wider bandgap than the bandgap of the base, can be used according to the present invention.

The capacitance ($C_{BC}$) between the base and the collector can be reduced by implanting $O^+$, $B^+$, or $H^+$ ions to a region just below the base outside the transistor. Transistors can be isolated into individual chips by ion implantation.

In the first and the second examples, an HBT is used as an active element. Vertical-type elements which are usable as active elements include a usual bipolar transistor, a thyristor, an HBT (hot electron transistor), and a resonance tunneling effect transistor. A vertical-type element and a transverse-type element can be combined in the transistor device. For example, an HBT and an HEMT (high electron mobility transistor), or an HBT and an FET can be combined. A transistor, a light emitting element and a light receiving element also can be combined.

In the first and the second examples, an MMIC having a plurality of transistors for power amplification in a microwave range is described. The present invention is also applicable to a single transistor used for power amplification in a microwave range, an IC used for super high-speed operation, and the like.

In the first and the second examples, the bump electrode 116 also acts as an emitter electrode. In the case where such a semiconductor chip is used in, for example, an MMIC used for high power or an IC for super high-speed operation, use of a bump electrode as an emitter electrode (namely, a source) may cause an inconvenience. In such a case, the bump electrode is connected to the base (namely, the gate) or the collector (namely, the drain); or the bump electrode is not used as an emitter electrode but is used only for releasing heat by providing an insulative layer between the bump electrode and the wire layer.

Semiconductor materials usable for the semiconductor layers include, as well as GaAs, compound semiconductors such as InP, SiC, GaP and GaSb, or single-element semiconductors such as C, Si, and Ge.

Materials usable for the transistor include lattice-matching materials such as InGaP/GaAs materials, InGaAs (P)/InAlAs materials, and InGaAs(P)/InP materials, as well as AlGaAs/GaAs materials, or lattice-mismatching materials such as InGaAs/(Al)GaAS/InP materials. the first and the second examples, the flip-chip is mounted on the AlN substrate having a metal pattern thereon. The substrate can be formed of any other material having satisfactory heat conductivity.

The substrate on which the flip-chip is to be mounted is not necessarily a single flat plate. For example, the substrate can have a through-hole or a via-hole, or can have a plurality of layers. The substrate can have any structure as long as the part which is connected to the semiconductor chip through the bump electrode is flat.

A plurality of semiconductor chips can be bonded on a single substrate. It is not always necessary that all the semiconductor chips are flip-chip-mounted on the substrate. When being used for a certain purpose, some of the semiconductor chips are flip-chip-bonded and the other chips are, for example, wire-bonded.

In order to release the heat, the substrate of the semiconductor chip can be shaved to reduce the thickness thereof. In such a case, the chip is combined with a heat releasing solder or a case cap, through which the heat is released.

According to the present invention, the moisture resistance of the semiconductor chip is improved and thus can be sealed only by resin injection. A lid for sealing the chip air-tight or a special element such as a seal ring for supporting the lid can be eliminated. Furthermore, a resistance which does not contribute to improvements in characteristics of the chip can be reduced, thereby improving the characteristics of the chip.

Accordingly, a high-performance HBT usable for power amplification in a microwave range and a semiconductor device including such an HBT such as an MMIC can be realized at reasonable cost. The realization of such an HBT and semiconductor device have significant industrial effects, Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A vertical-type transistor device, comprising:
   a transistor unit including a collector, base, and emitter provided on a surface of a substrate, the transistor unit extending in a first direction; and
   a bump electrode formed over the transistor unit, electrically connected to one of the collector, base, and emitter, and crossing the transistor unit in a second direction perpendicular to the first direction, wherein the bump electrode has a first area that overlaps the transistor unit and a second area that does not overlap the transistor unit, a size of the second area in the first direction is greater than the size of the first area in the first direction, and a shape of the bump electrode has no interior angle exceeding 270°.

2. A vertical-type transistor device according to claim 1, wherein the bump electrode is butterfly-shaped and further has another second area that does not overlap the transistor unit the first area being located between the two second areas along the second direction, and two third areas, one third area located between each of the second areas and the first area, each third area having a dimension that changes in the first direction along the second direction.

3. A vertical-type transistor device according to claim 1, wherein the transistor unit is finger-shaped.

4. A vertical-type transistor device having an emitter-up structure, comprising:
   a collector layer, a base layer, and an emitter layer stacked sequentially in this order and collectively extending in a first direction;
   an emitter electrode electrically connected to the emitter layer;
   two collector electrodes electrically connected to the collector layer; and
   a take-out electrode connected to the emitter electrode extending in a second direction perpendicular to the first direction from a top area of the emitter electrode and partially surrounding the collector electrode,
   wherein the collector electrodes each have a width in the range between 5 $\mu$m to 10 $\mu$m in the second direction.

5. A vertical-type transistor device having a collector-up structure, comprising:
   an emitter layer, a base layer, and a collector layer stacked sequentially in this order and collectively extending in a first direction;
   a collector electrode electrically connected to the collector layer;
   two emitter electrodes electrically connected to the emitter layer; and
   a take-out electrode connected to the collector electrode extending in a second direction perpendicular to the first direction from a top area of the collector electrode and partially surrounding the emitter electrodes,
   wherein the emitter electrodes each have a width in the range between 5 $\mu$m and 10 $\mu$m in the second direction.

6. A vertical-type transistor device according to claim 4, wherein the take-out electrode is arch-shaped.

7. A vertical-type transistor device according to claim 5, wherein the take-out electrode is arch-shaped.

8. A semiconductor device usable for power amplification, comprising:
   a semiconductor substrate; and
   at least one vertical-type transistor device mounted on the semiconductor substrate in a monolithic manner including:
      a transistor unit including a collector, base and emitter provided on a surface of a substrate, the transistor unit extending in a first direction; and
      a bump electrode formed over the transistor unit, electrically connected to one of the collector, base, and emitter, and crossing the transistor unit in a second direction perpendicular to the first direction, wherein the bump electrode has a first area that overlaps the transistor unit and a second area that does not overlap the transistor unit, a size of the second area in the first direction is greater than the size of the first area in the first direction, and a shape of the bump electrode has no interior angle exceeding 270°.

9. The semiconductor device according to claim 8, wherein the bump electrode is butterfly-shaped and further has another second area that does not overlap the transistor unit the first area being located between the two second areas along the second direction, and two third areas, one third area located between each of the second areas and the first area, each third area having a dimension that changes in the first direction along the second direction.

10. A semiconductor device usable for power amplification, comprising:
    a semiconductor substrate; and
    at least one vertical-type transistor device having an emitter-up structure and mounted on the semiconductor substrate in a monolithic manner including:

a collector layer, a base layer, and an emitter layer stacked sequentially in this order and collectively extending in a first direction;

an emitter electrode electrically connected to the emitter layer;

two collector electrodes electrically connected to the collector layer; and a take-out electrode connected to the emitter electrode extending in a second direction perpendicular to the first direction from a top area of the emitter electrode and partially surrounding the collector electrode, wherein the collector electrodes each have a width in the range between 5 μm to 10 μm in the second direction.

11. A semiconductor device, comprising:

a semiconductor substrate; and at least one vertical-type transistor device having a collector-up structure and mounted on the semiconductor substrate in a monolithic manner including:

an emitter layer, a base layer, and a collector layer stacked sequentially in this order and collectively extending in a first direction;

a collector electrode electrically connected to the collector layer;

two emitter electrodes electrically connected to the emitter layer; and a take-out electrode connected to the collector electrode extending in a second direction perpendicular to the first direction from a top area of the collector electrode and partially surrounding the emitter electrodes, wherein the emitter electrodes each have a width in the range between 5 μm and 10 μm in the second direction.

12. A semiconductor device, comprising:

a semiconductor chip including at least one transistor;

an insulative thin layer formed on a surface of the semiconductor chip for protecting the surface of the semiconductor chip;

a wire layer electrically connected to a part of the transistor through an opening in the insulative thin layer; and a bump electrode formed on and electrically connected to the wire layer, the bump electrode being plastically deformable for connecting the semiconductor chip to a mounting substrate, wherein the opening in the insulative thin layer has an inner contour surrounding and spaced from the bump electrode by a gap of 1.5 μm or less.

13. A semiconductor device, comprising:

a semiconductor chip including at least one transistor;

an insulative thin layer formed on a surface of the semiconductor chip for protecting the surface of the semiconductor chip;

a wire layer electrically connected to a part of the transistor through an opening in the insulative thin layer; and a bump electrode formed on and electrically connected to the wire layer, the bump electrode being plastically deformable for connecting the semiconductor chip to a mounting substrate, wherein the opening in the insulative thin layer has an inner contour partially surrounding and spaced from the bump electrode by a gap of 1.5 μm or less.

14. A semiconductor device according to claim 12, wherein the bump electrode is formed of a material selected from the group consisting of gold and an alloy including gold.

15. A semiconductor device according to claim 13, wherein the bump electrode is formed of a material selected from the group consisting of gold end an alloy including gold.

* * * * *